United States Patent [19]

David et al.

[11] 4,453,030

[45] Jun. 5, 1984

[54] SOLAR CELL HAVING A GROOVED PHOTOSENSITIVE SURFACE

[76] Inventors: Gérard R. David, 14870 Cambes-En-Plaine; Daniel M. Pincon, 23 rue Chateaubriand, 14000 Caen, both of France

[21] Appl. No.: 291,160

[22] Filed: Aug. 10, 1981

[30] Foreign Application Priority Data

Aug. 29, 1980 [FR] France .................................. 80 18783

[51] Int. Cl.³ ............................................ H01L 31/06
[52] U.S. Cl. .................................... 136/256; 136/255; 357/30
[58] Field of Search ........................ 136/255, 256, 259; 357/30

[56] References Cited

U.S. PATENT DOCUMENTS

4,135,950  1/1979  Rittner ................................ 136/255
4,322,571  3/1982  Stanbery ............................. 136/255

OTHER PUBLICATIONS

M. Wolf, "Photovoltaics II: Flat Panels," *IEEE Spectrum*, Feb. 1980, pp. 32–33.

*Primary Examiner*—Aaron Weisstuch

[57] ABSTRACT

A solar cell in which the photosensitive surface is composed of parallel and adjoining grooves is provided with electrically-conductive laminations situated in the grooves and bearing on at least one of the groove sidewalls. This contruction reduces the losses due to light reflection by positioning the laminations such that light reflected off them is ultimately directed onto the grooves and recovered.

4 Claims, 3 Drawing Figures

SOLAR CELL HAVING A GROOVED PHOTOSENSITIVE SURFACE

BACKGROUND OF THE INVENTION

The present invention relates to a solar cell containing a semiconductor body having a major surface through which light is admitted, in the proximity of which major surface a semiconductor junction is formed, a network of electrically conductive laminations bearing on the major surface and being connected to at least one collector band, the assembly of the laminations and of the band forming one of the electrodes of the cell, and the major surface being provided with grooves.

The invention relates in particular, but not exclusively, to devices having solar cells and light concentration means, in which it is possible by means of an optical system to increase the light density per surface unit area of the cells and which consequently provide larger currents than the usual devices without concentration means.

The efficiency of the light/electric current conversion of a solar cell is related in particular to the light absorption capacity of the major surface thereof: a part of the light is absorbed, while another part is reflected and is hence lost for the conversion. Besides now general use of so-called antireflection layers, which are deposited on the major surface and which reduce the reflectivity thereof, it has been proposed for increasing the absorption capacity to provide the major surface with fine grooves having a triangular cross-section so that the light which is reflected by one side of the grooves can be received by the other side, and vice versa.

An example of a solar cell having this structure is disclosed in U.S. Pat. No. 4,135,950. The wafer of silicon which is cut with a <100> face and is locally masked on the major surface thereof by fine parallel spaced oxide strips is subjected to a chemical etching treatment in a solution of hydrazine. In this way, parallel grooves are formed in known manner, the width and depth of which are regular, the depth being substantially equal to 7/10 of the width. A junction is formed and adjoins the surface of the grooves, and fine metal laminations are deposited on surfaces which lie on top of the teeth which are determined by the grooves, said laminations forming one of the electrodes of the cell.

Due to its groove structure said cell has a good absorption coefficient compared with that of cells having a substantially flat surface. Nevertheless, a non-negligible part of the incident light is still lost, namely that which is reflected by the fine metal electrode laminations, in spite of the considerable improvement which is provided by the grooves. The surface occupied by the laminations represents, as in any solar cell, a non-negligible part of the overall area of the major surface.

SUMMARY OF THE INVENTION

The solar cell which forms the subject matter of the invention is designed to further reduce the losses by light reflection—more precisely, the losses which relate to the inevitable presence of an electrode on the major surface.

A particular object of the invention is the manufacture of solar cells for devices having light concentration means, in which, due to the higher density of the current than in the cells which operate without concentration means, the area which is occupied by the laminations of the electrode is also larger and amounts to about 15% of the overall area of the major surface.

The invention is based on a new location of the electrically conductive laminations which form the said electrode and by means of which a large part of the light which they receive can be retained.

According to the invention, a solar cell of the type described above is characterized in that the electrically conductive laminations are situated in the grooves where they bear on a part of at least one of the walls which laterally bound the grooves.

Light which is incident on the surface of a lamination is reflected for the greater part (approximately 90% in the case of laminations having an outer layer of silver) onto the opposite wall and through the latter can penetrate into the semiconductor material. This light, which in prior art cells is lost, is recovered for the greater part in cells according to the invention. Thus such cells have an efficiency which is larger than that of comparable prior art cells, which is an important advantage.

On the other hand, whereas in a known cell having a flat or grooved major surface the width of the electrically conductive laminations must be chosen to be as small as possible for minimizing the shaded surface of semiconductive material, in a cell according to the invention said width is much less critical because the light which reaches the laminations is not lost. Consequently, as regards the deposition of the network of laminations, this is not more difficult to realize on the inclined surface of the grooves than on the upper surface of a cell having a substantially flat surface, for in the case of a cell according to the invention the tolerance of the width of the deposition may be chosen to be rather large.

The grooves having a triangular cross-section which are parallel to each other also adjoin each other, that is to say they contact each other two by two according to the upper edge of the separation teeth which in themselves are triangular. In practice, and taking into account the inevitable irregularities during manufacture, the teeth at their summit are made as narrow as possible.

Although the electrically conductive laminations can be placed at any depth level within the grooves, it is desirable for convenience of manufacture that they be situated on the upper part, the widest part, of the grooves.

According to a first embodiment of a solar cell according to the invention the laminations are provided on only one of the walls of each groove. The width of a lamination is chosen to be such that any non-absorbed light ray which is incident on the other wall, according to a direction which is substantially perpendicular to the plane of the plate, be reflected onto a bare part of the wall which supports the lamination. The width limit of a lamination corresponds substantially to the distance which separates the upper part of the wall on which it bears from the impact line, on the said wall, of the light rays which are reflected from the top of the oppositely-located wall.

A solar cell is preferably disposed directly facing the sun; this applies in particular to devices having concentration means which generally are equipped with means permitting tracking of the sun. It is hence logical that the width of the electrically conductive laminations be determined, as described above, on the basis of a perpendicular illumination of the cell.

According to a second embodiment of a cell in accordance with the invention the laminations are provided on both walls of each groove. This embodiment, which relates to an increase of the area which is occupied by the laminations, involves a small reduction in the light/current conversion efficiency with respect to the first embodiment; in fact the laminations absorb a small part ($\simeq 10\%$) of the light which they receive and the amount of absorbed light, however small it is, is clearly proportional to the area which they occupy. To the contrary, the increase of the surface area of the laminations provides a reduction of the series resistance of the cell, which is notable for cells having a large current density such as devices with concentration means.

The width limit of the laminations in the second embodiment is determined in the same manner as in the first embodiment due to the position of the line of impact which is determined on another groove wall by the rays which are reflected by the other wall and originate from the top of said latter wall.

The method of manufacturing solar cells in accordance with the invention does not substantially differ from the known method of manufacturing cells having a grooved major surface, for example, as described in the above-stated U.S. Patent Specification. Starting materials are preferably wafers of P-type silicon which are cut with <100> faces which by chemical etching treatment are provided with adjoining parallel grooves. A P-N junction is then formed by diffusion of a suitable dopant through the major surface. Then the network of electrically conductive laminations and collector band are formed either by deposition of a metal layer which is then subjected to a photo-etching treatment, or by vapor deposition at a suitable angle of incidence. The rear face is then covered with a metal deposit which forms the rear electrode of the cell and finally an antirelection layer is deposited.

BRIEF DESCRIPTION OF THE DRAWINGS

The invention will now be described in greater detail, by way of example, with reference to the accompanying drawings in which.

The drawings are diagrammatic and not drawn to scale, in particular as regards the dimensions of thickness of the various elements, for reasons of clarity.

DESCRIPTION OF THE PREFERRED EMBODIMENTS

Figure 1:
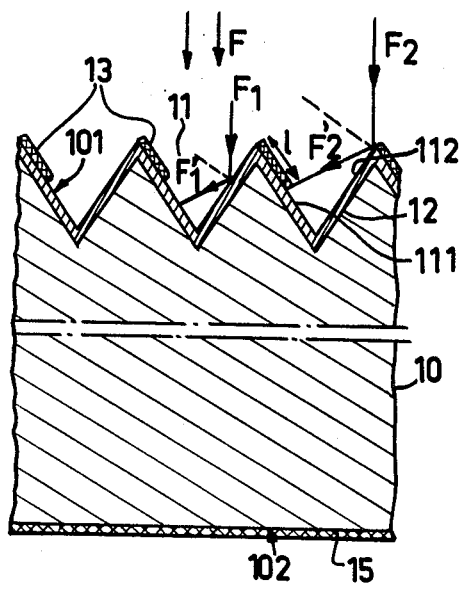
FIG. 1 is a cross-sectional view transverse to the direction of the grooves of a part of a solar cell according to a first embodiment of the invention.
Figure 2:
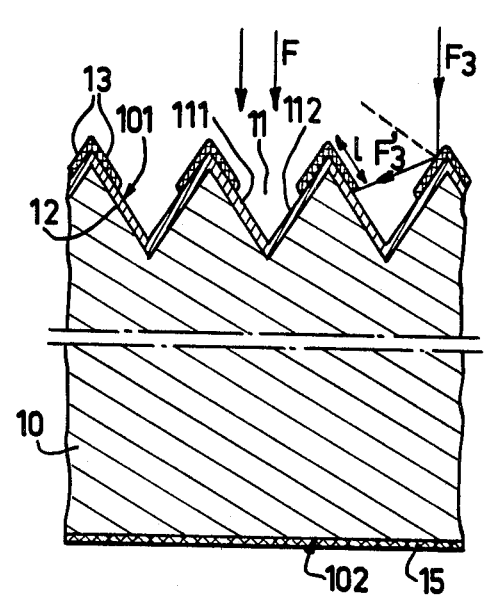
FIG. 2 is also a cross-sectional view perpendicular to the direction of the grooves of a part of a solar cell according to a second embodiment of the invention and FIG. 3 is a perspective elevational view of a part of the solar cell according to a first embodiment which in particular shows the connection region between the electrically conductive laminations and the collector band which form the front electrode.

FIGS. 1 and 2 show a part 10 of a silicon wafer comprising the body of a solar cell. This wafer or plate has a front face or major surface 101, through which the light shown diagrammatically by the arrows F is admitted, and a rear face 102.

The major surface 101 has grooves 11 of triangular cross-section which extend parallel to each other substantially over the whole surface (in this case in a direction perpendicular to the plane of the drawing) and adjoint each other. These grooves have, for example, a maximum width of 100 $\mu$m.

At a small depth ($\simeq 0.5$ $\mu$m) a P-N junction 12 follows the grooved configuration of the surface 101.

A network of electrically conductive laminations 13 which are connected to a wider lamination or collector band 14 (visible in FIG. 3) partly covers the surface 101, the assembly of said laminations and said band 14 constituting the front electrode of the cell. The position of the laminations 13 in the groove 11 is in principle of no importance. For convenience of manufacture of these laminations, however, they should be situated in the proximity of the summit of the teeth which mutually determine the grooves.

A conductive surface 15 deposited on the rear surface 102 of the plate 10 constitutes the other electrode of the said cell.

According to the invention, the solar cell formed by the plate 10 is characterized in that the electrically conductive laminations 13 are situated in the grooves 11 where they bear on at least one of the walls 111, 112 and laterally bound the grooves.

According to a first embodiment of the invention corresponding to FIG. 1; the laminations 13 are provided only on one of the walls 111 of each groove.

The width of a lamination is chosen to be such that each light ray, for example light ray $F_1$ which is incident on the other wall 112, is reflected (beyond the light energy which is absorbed by the semiconductor material at the surface of the wall 112) according to $F'_1$ onto an uncovered part of the wall 111 which supports the lamination. Rays, for example $F_2$, which in the proximity of the summit of a tooth between the grooves, are incident on a wall 112, for example, from above the said wall are reflected according to $F'_2$ to the opposite wall 111; the line of impact of the rays $F'_2$ on the wall 111 determines the width limit l of the lamination 13. If the lamination were to extend in width beyond the above-defined line of impact, rays which are reflected on the wall 112 would again be reflected by the lamination back to the exterior. What applies to a given groove and a given lamination naturally also applies to the assembly of the entire groove and lamination cell.

According to a second embodiment of the solar cell corresponding to FIG. 2, the laminations 13 are provided on both walls 111 and 112. The width limit of the laminations in this second case is determined in the same manner as in the first embodiment. Rays $F_3$ which are incident on a lamination at the top of a wall are reflected (beyond the light energy absorbed by that lamination) according to $F'_3$ to the opposite wall. The line of impact of the rays $F'_3$ determines the width limit l of the laminations 13. At a maximum width of the grooves of 100 $\mu$m, the width of the laminations is chosen between 10 and 30 $\mu$m, according to the density of the electrical current to be generated.

Figure 3:
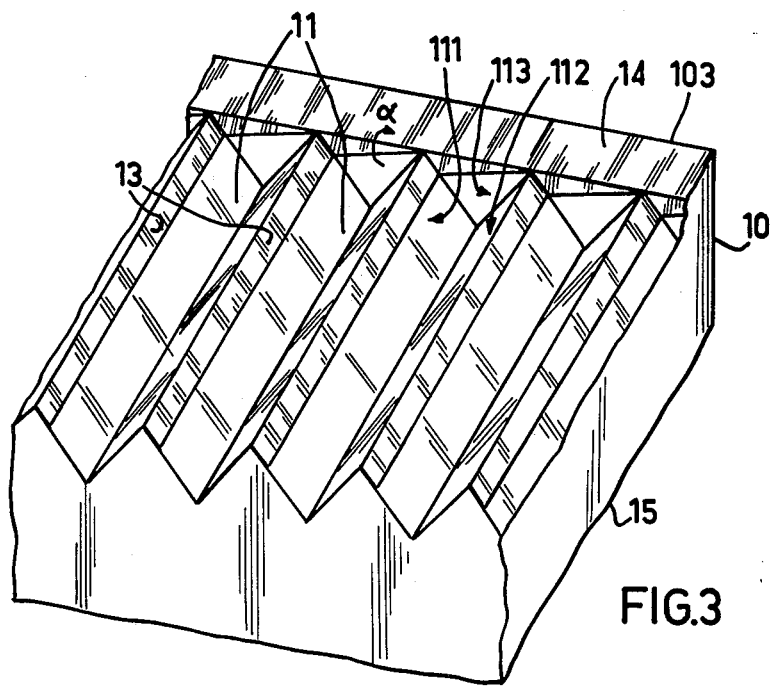

In FIG. 2 and FIG. 3 the same reference numerals are used for corresponding elements as in FIG. 1. Moreover, in FIG. 3 the electrically conductive band 14 is shown which collects the currents which are received by the various parallel arms 13. The band 14 bears on an edge portion 103 of the plate 10 not provided with grooves. The laminations 13 which follow the grooves over their whole length partly cover at the end the transverse walls 113 of the grooves and the part 103 of the wafer where they meet the band 14. The upward step to be made for the required connection of 13 and 14 does not break the electrically conductive coating because the angle of said step is obtuse; this is the case when the grooves are obtained by anisotropic etching of silicon which is cut according to a <100> face. The relevant angle then lies near 125°.

For the manufacture of a cell as described above, the starting material is a wafer of silicon which is doped, for example, with a P type dopant, and the faces of which are oriented according to the <100> face of the crystal lattice. This wafer is covered with a layer of silicon oxide. Fine strips are cut by photoetching from an oxide layer deposited on the major surface 101, which strips are parallel to a <111> plane and situated at equal distances from each other; the width of these strips and their distribution pitch are carefully chosen. The wafer is then subjected to a chemical etching treatment, for example, by means of an alkaline solution in water. With a chosen etching depth the grooves, which at the beginning of the treatment have a trapezoidal profile, are triangular at the end of the treatment; if the width and the distribution pitch of the fine oxide strips are chosen correctly, due to the effect of lateral undercutting, two adjacent grooves are formed which are separated by very little semiconductor material at the summit of the intermediate tooth and then substantially adjoin said level. The walls 111, 112 and 113 of the grooves 11 have an angle of inclination of approximately 55° with respect to the plane of the wafer 10. This angle corresponds to the angle between a <100> face and a <111> face of the crystal lattice.

When the grooves have been formed, the junction 12 is formed by diffusion, for example of phosphorus, from the face 101.

In order to process the network of laminations 13 simultaneously with the band 14, the next step for the FIG. 1 embodiment is preferably evaporation at a given angle of incidence, with the separating teeth between the grooves of the plate serving as a mask. The deposition is of titanium-palladium-silver contact metallization as is usual for solar cells.

A layer of titanium-palladium-silver is then deposited on the face 102 of the wafer to form the rear electrode 15 of the cell and finally the antireflection layer is formed (this is not shown in the Figures).

In the case of a solar cell according to the FIG. 2 embodiment, the lattice of the laminations 13 is obtained by evaporation of a metal layer on the whole of the surface 101 followed by etching said layer through a mask of a photosensitive lacquer. The use of the angular evaporation method would necessitate two evaporations at different angles of incidence.

It will be obvious that the above-described method of manufacturing a solar cell according to the invention is not particularly difficult as conventional methods are used.

What is claimed is:

1. A solar cell comprising a semiconductor wafer having a major light-receiving surface, which comprises:
   a semiconductor junction adjacent to said major surface;
   a plurality of substantially V-shaped parallel adjoining grooves in said major surface, the sidewalls of each adjacent pair of grooves intersecting at an apex; and
   a network of electrically conductive laminations on said grooves and connected together by a collector band to form an electrode of said solar cell, each lamination covering only the upper part of at least one of the pair of sidewalls extending from each apex.

2. A solar cell as claimed in claim 1, characterized in that the electrically conductive laminations are provided on only one of the sidewalls of each groove.

3. A solar cell as claimed in claim 1, characterized in that the electrically conductive laminations are provided on both sidewalls of each groove.

4. A solar cell as claimed in claim 1, characterized in that the width limit of each electrically conductive lamination is substantially equal to the distance which separates the uppermost part of the sidewall of the groove on which it bears from the line of impact on said sidewall of light rays which are reflected from the uppermost part of the opposite sidewall and correspond to incident rays which impinge on said latter sidewall from a direction which is perpendicular to the plane of said wafer.

* * * * *

UNITED STATES PATENT AND TRADEMARK OFFICE
CERTIFICATE OF CORRECTION

PATENT NO. : 4,453,030

DATED : June 5, 1984

INVENTOR(S) : GERARD ROBERT DAVID ET AL

It is certified that error appears in the above-identified patent and that said Letters Patent is hereby corrected as shown below:

On the Title Page:

The "Assignee" and the "Attorney, Agent, or Firm" is missing

Please add --Assignee: U.S. Philips Corporation, New York, N.Y.-- and

--Attorney, Agent, or Firm-Thomas A. Briody; Robert T. Mayer; Steven R. Biren--

Signed and Sealed this

Eleventh Day of February 1986

[SEAL]

Attest:

DONALD J. QUIGG

Attesting Officer     Commissioner of Patents and Trademarks